US 6,668,348 B1

(12) United States Patent
Nakamura

(10) Patent No.: US 6,668,348 B1
(45) Date of Patent: Dec. 23, 2003

(54) MEMORY-MOUNTING INTEGRATED CIRCUIT AND TEST METHOD THEREOF

(75) Inventor: Hideyuki Nakamura, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 377 days.

(21) Appl. No.: 09/618,824

(22) Filed: Jul. 18, 2000

(30) Foreign Application Priority Data

Jul. 19, 1999 (JP) .......................................... 11-205391

(51) Int. Cl.$^7$ ............................ G01R 31/28; G11C 7/00
(52) U.S. Cl. ...................................... 714/733; 365/201
(58) Field of Search ........................... 714/733, 718; 365/201

(56) References Cited

U.S. PATENT DOCUMENTS 5,844,914 A * 12/1998 Kim et al. .................... 714/718
6,108,252 A * 8/2000 Park ........................ 365/189.07
6,148,426 A * 11/2000 Kim et al. .................... 714/730

FOREIGN PATENT DOCUMENTS

| JP | 5-6698 | 1/1993 | ........... G11C/29/00 |
|---|---|---|---|
| JP | 8-328964 | 12/1996 | ........... G06F/12/16 |
| JP | 9-251796 | 9/1997 | |
| JP | 10-242288 | 9/1998 | ........... H01L/21/82 |
| JP | 10-302499 | 11/1998 | |
| JP | 11-16393 | 1/1999 | ........... G06F/11/22 |

* cited by examiner

Primary Examiner—Phung M. Chung
Assistant Examiner—Esaw Abraham
(74) Attorney, Agent, or Firm—Scully, Scott, Murphy & Presser

(57) ABSTRACT

To provide such a memory-mounting integrated circuit as well as a memory test method that can reduce costs to incur for a tester, regulate the number of the input-output terminals for testing, and nevertheless can monitor from outside all the contents of defects in principle. The memory-mounting integrated circuit on which at least a BIST circuit and a memory are mounted, in which the above described BIST circuit includes a data storing apparatus to store the data in a normal memory, a comparing apparatus to compare a memory test result signal from the above described memory with data from the above described data storing apparatus to output a first comparing signal, a control apparatus to control to implement outputting outward from the first comparing signal outputted by the above described comparing apparatus, and an output apparatus to output defective data outward by the above described control apparatus.

11 Claims, 5 Drawing Sheets

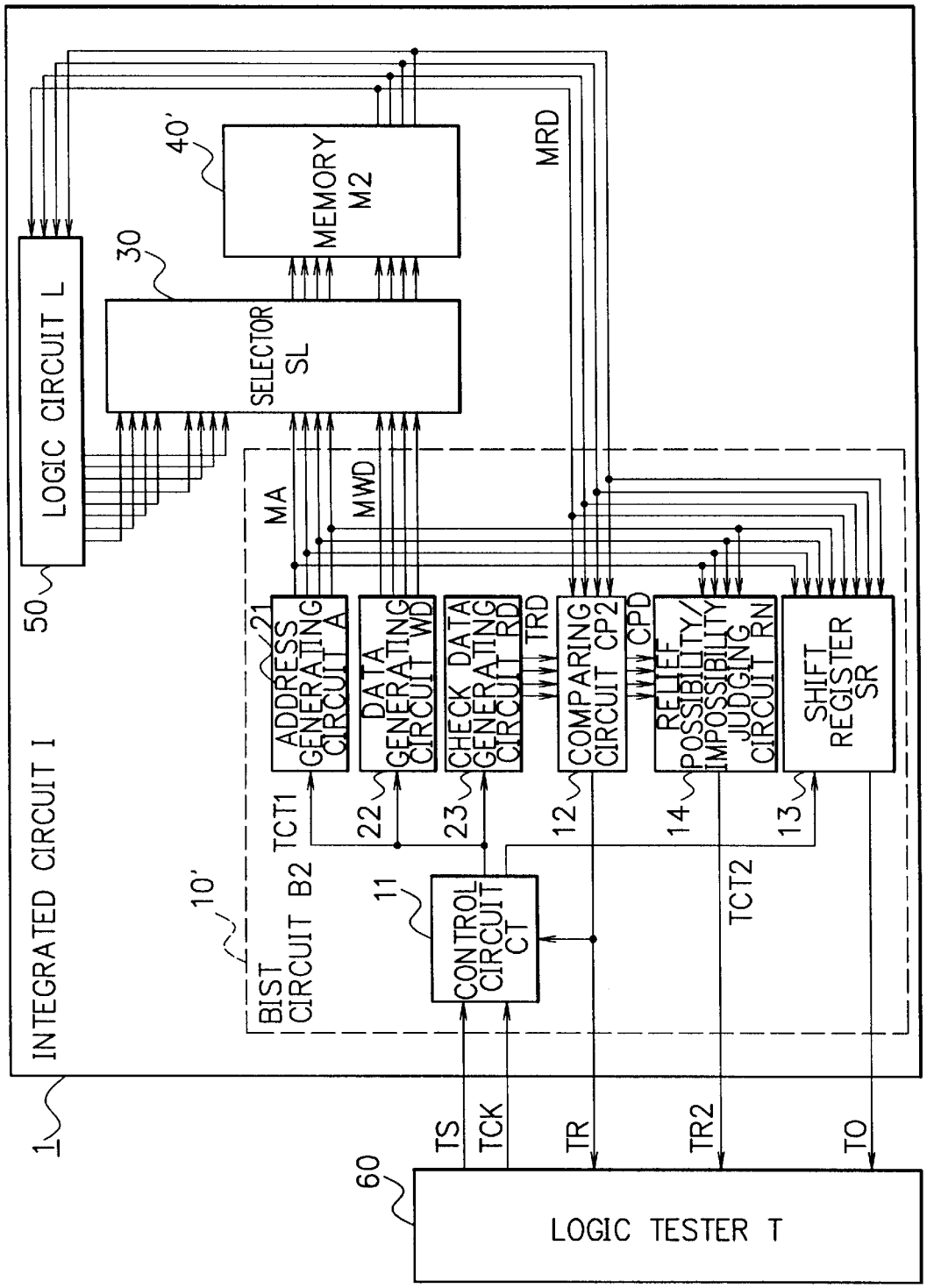

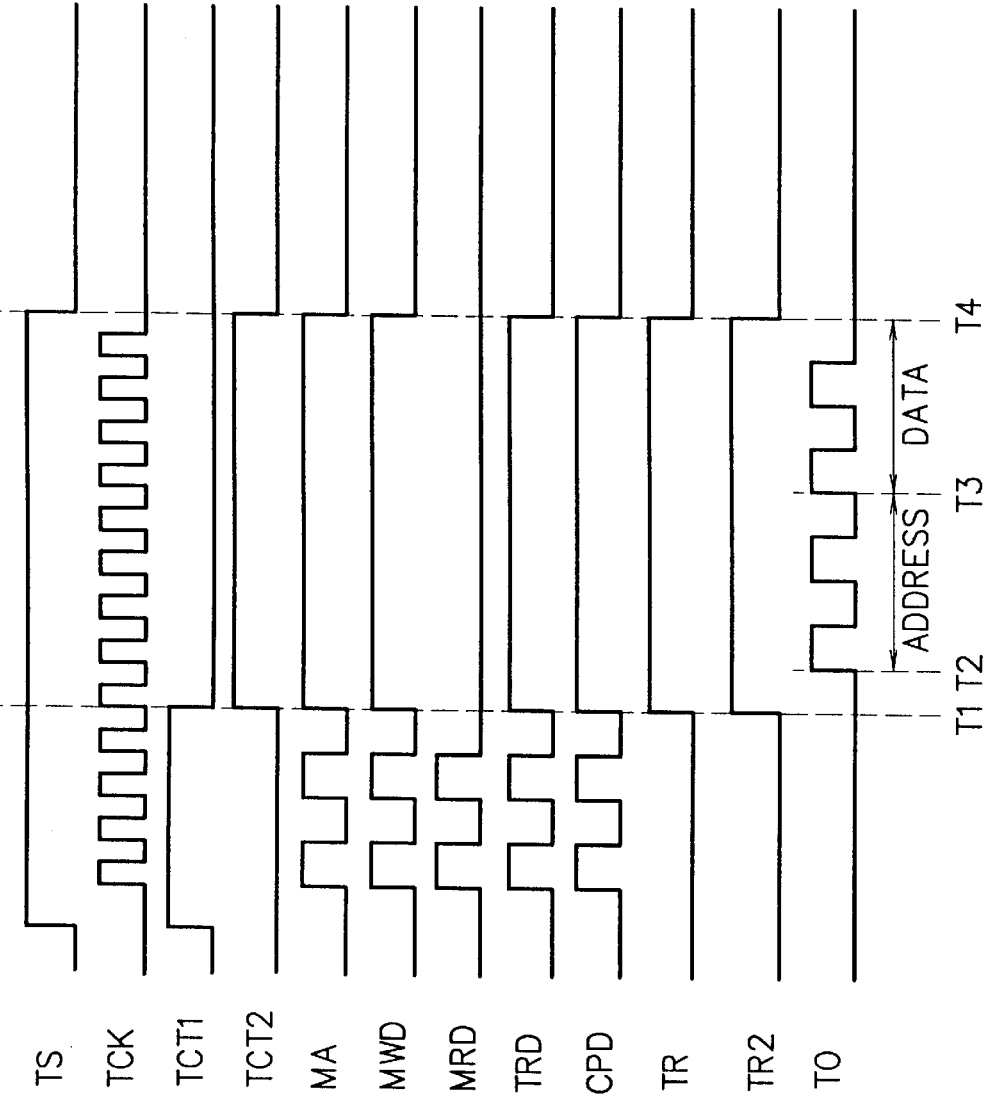

MEMORY-MOUNTING INTEGRATED CIRCUIT AND TEST METHOD THEREOF

BACKGROUND OF THE INVENTION

The present invention relates to a memory-mounting integrated circuit and a test method of the memory region of a memory-mounting integrated circuit onto which a memory is mounted.

DESCRIPTION OF THE RELATED ART

Capacity of a memory to be mounted on an integrated circuit is becoming massive every year and importance of a test method on such a memory with massive capacity is becoming intensive every day. As a method to test such a memory for a memory-mounting integrated circuit, there is a method in which a memory is separated from a logic circuit so as to test the memory alone with a tester from outside.

However, when such a method is going to go with a test on the logic section using a logic tester at the same time, a test vector gets fairly long and thus the tester will need a lot of vector memories. In addition, when a memory tester is independently used apart from the test on a logic circuit, costs for a tester to be used will be additionally incurred. In addition, not only that but also rapid testing will generally become impossible since it is necessary for a separated memory terminals to be drawn out to outside an integrated circuit for measurement.

Moreover, a memory of multi-bits more likely gives rise to a shortage of the number of input-output terminals securable for a test.

As a test method to avoid such a disadvantage, there is a BIST (Built in Self Test) method. This method gives rise to an advantage that a test vector generating circuit to test a memory on an integrated circuit and a quality judging circuit are mounted on an integrated circuit so that an enlarged test vector or a special memory tester and an input-output terminal for testing becomes no longer necessary and the memory can be tested under a rapid operation equivalent to an actual working conditions.

Thus, simplifying the testing is a major object of the BIST, but in general test results are limited to quality judging only, and in the case where an integrated circuit is defective, it is configured that it is impossible to know contents of defectiveness such as what kind of the defect it is in fact or in which portion of a memory of an integrated circuit the defective bit is.

Therefore, there is a disadvantage that a normally known BIST test method cannot be utilized for redundancy relief judgment to improve the yield factor of a memory. In addition, when problems on manufacturing of integrated circuits such as decrease in the yield factor arise, such information of the defective bit cannot be efficiently used for analyses on the above described problems, etc., preventing understanding on the cause with regard to manufacturing, and thus it is not reflection of a production line.

Among these problems, a technology using BIST for redundancy relief judgment is exemplified by the invention described in Japanese Patent Laid-Open No. HEI 9-251796 (251796/1997). However, the object of the technology disclosed in that publication is purely redundancy relief, and is limited by having an object to monitor from outside only the information on possibility of redundancy relief or on which line to be replaced so as to make relief available.

In addition, Japanese Patent Laid-Open No. HEI 10-302499 (302499/1998) also describes an invention similar to the above described one, and as a principle for such an invention, the information necessary for redundancy relief according to defects is piled temporarily in a separate memory called fail memory, and is outputted to the outside logic tester at completion of the test so that the test results in the logic section as well as quality on the integrated circuit are judged and the data necessary for redundancy relief is arranged to be prepared. This principle gives rise to a limit on the information available for notice outside in accordance with sizes of mountable fail memories. Accordingly, the information available therefrom only cannot provide with information such as the quantity of defective bits or information on sections thereof as well as address dependency of the defective bits or contents on defects, etc., necessary to solve essential problems when they are given rise to in processes or circuits.

SUMMARY OF THE INVENTION

The object of the present invention is to provide such a memory-mounting integrated circuit as well as a memory test method that can reduce costs to incur for a tester, regulate the number of the input-output terminals for testing, and nevertheless can monitor from outside all the contents of defects in principle.

The invention of a memory-mounting integrated circuit according to claim 1 is a memory-mounting integrated circuit on which at least a BIST circuit and a memory are mounted, in which the above described BIST circuit includes, data storing means for storing the data in a normal memory, comparing means for comparing a memory test result signal from the above described memory with data from the above described data storing means to output a first comparing signal, control means for controlling to implement outputting outward from the first comparing signal outputted by the above described comparing means, and output means for outputting defective data outward by the above described control means.

The invention of a memory-mounting integrated circuit according to claim 2 is a memory-mounting integrated circuit, according to claim 1, wherein said comparing signal is a defective detecting signal.

The invention of a memory-mounting integrated circuit according to claim 3 A memory-mounting integrated circuit on which at least a BIST circuit and a memory are mounted, wherein said BIST circuit comprises data storing means for storing data in a normal memory, comparing means for comparing a memory test result signal from said memory with the data from said data storing means for outputting a first comparing signal, control means for controlling to implement outputting outward from the first comparing signal outputted by said comparing means, output means for outputting defective data outward by said control means, address generating means for operating said memory and data generating means for testing the data, wherein said control means control said address generating means and said data generating means.

The invention of a memory-mounting integrated circuit according to claim 4 comprises, a memory-mounting integrated circuit on which at least a BIST circuit and a memory are mounted, wherein said BIST circuit comprises: data storing means for storing data in a normal memory, comparing means for comparing a memory test result signal from said memory with the data from said data storing means for outputting a first comparing signal, control means for controlling to implement outputting outward from the first comparing signal outputted by said comparing means, output means for outputting defective data outward by said control means, and judging means for comparing said memory test result signal with data from said data storing means so as to determine ending of a test or continuation of the test.

The invention of a memory-mounting integrated circuit according to claim 5 comprises, a memory-mounting integrated circuit on which at least a BIST circuit and a memory are mounted, wherein said BIST circuit comprises: data storing means for storing data in a normal memory, comparing means for comparing a memory test result signal from said memory with the data from said data storing means for outputting a first comparing signal, control means for controlling to implement outputting outward from the first comparing signal outputted by said comparing means, output means for outputting defective data outward by said control means, address generating means for operating said memory, data generating means for testing the data wherein said control means control said address generating means and said data generating means, and judging means for comparing said memory test result signal with data from said data storing means so as to determine ending of a test or continuation of the test.

The invention of the test method of a memory-mounting integrated circuit according to test claim 6 is a method of testing a memory region of the memory-mounting integrated circuit on which a BIST circuit and a memory are mounted, wherein said test method is featured by outputting outward only data on addresses where defects are found and addresses.

The invention of the test method of a memory-mounting integrated circuit according to test claim 7 is a method of a testing memory region method of a memory-mounting integrated circuit to test a memory region of the memory-mounting integrated circuit on which a BIST circuit and a memory are mounted, wherein said test method is featured by outputting outward only data on addresses where defects are found and addresses, said memory region is halted in the case where only the data on addresses in which said defects are found and the addresses are outputted outward, and the testing on said memory region is resumed when said outputting comes to an end.

The invention of the test method of a memory-mounting integrated circuit according to test claim 8 is a method of a testing of the memory-mounting integrated circuit on which a BIST circuit and a memory are mounted, wherein said test method is featured by outputting outward only data on addresses where defects are found and addresses, and end of the testing or continuation of the testing is determined by the data on addresses where the above described defects are found and the addresses.

The invention of the test method of a memory-mounting integrated circuit according to test claim 9 is a method of the memory-mounting integrated circuit on which a BIST circuit and a memory are mounted, wherein said test method is outputting outward only data on addresses where defects are found and addresses, said memory region is halted in the case where only the data on addresses in which said defects are found and the addresses are outputted outward, the testing on said memory region is resumed when said outputting comes to an end and end of the testing or continuation of the testing is determined by the data on addresses where the above described defects are found and the addresses.

BRIEF DESCRIPTION OF THE DRAWINGS

The objects and features of the present invention will become more apparent from the consideration of the following detailed description taken in conjunction with the accompanying drawings, in which:

FIG. 4 is a block diagram on a device according to a second embodiment of the present invention; and FIG. 5 is a timing chart on a device according to the second embodiment of the present invention.

DESCRIPTION OF THE PREFERRED EMBODIMENTS

A memory-mounting integrated circuit as well as a test method thereon according to the present invention is provided with additional function by a particular memory BIST circuit to be installed so as to enable to notify addresses of defective bits of memories and data to outside and enable to realize this with the minimum number of the input-output terminals for testing and within the shortest test period.

First Embodiment

Figure 1:
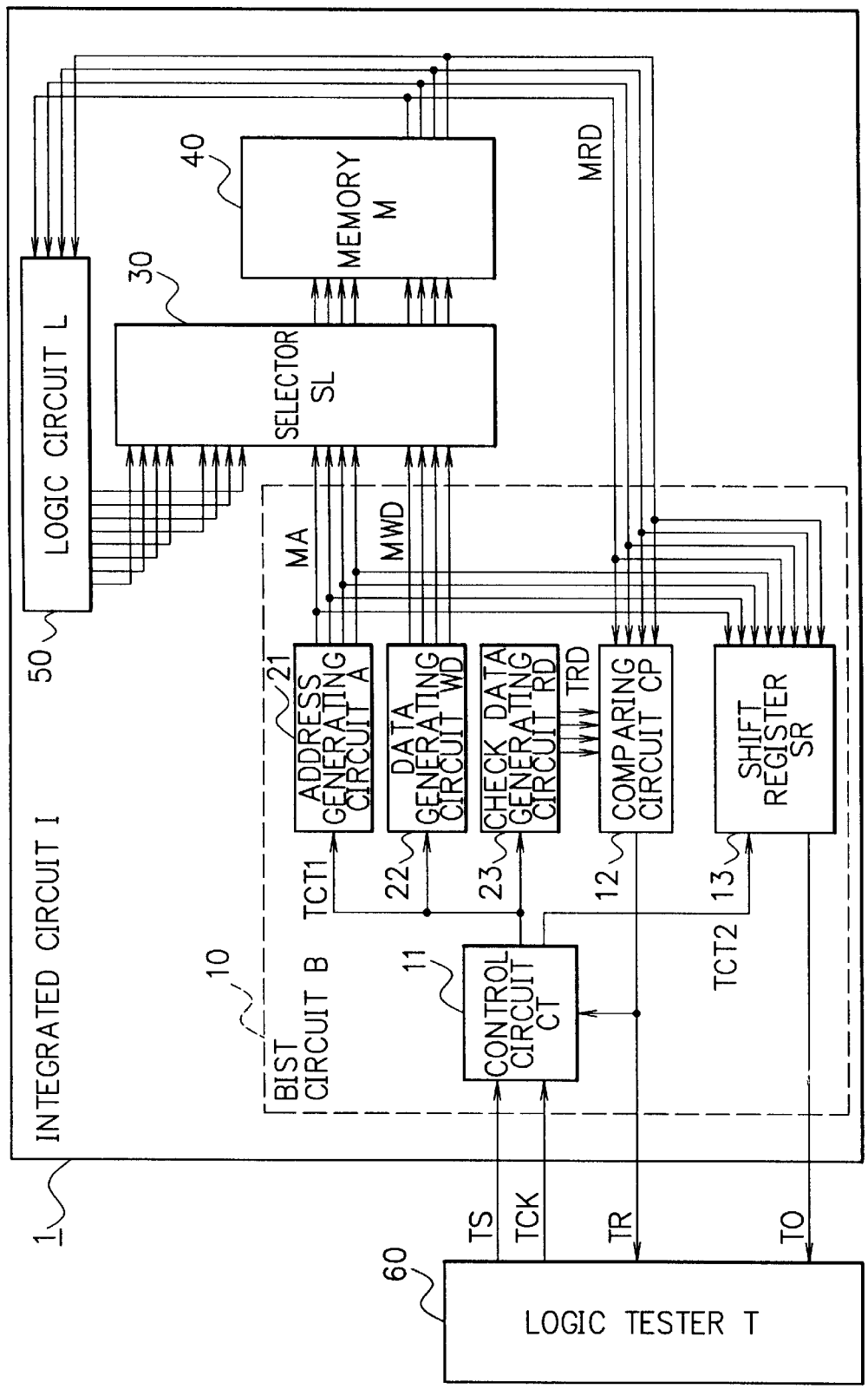
FIG. 1 is a block diagram on a device according to a first embodiment of the present invention.

FIG. 1 depicts a schematic view of a memory-mounting integrated circuit according to the present invention.

A shift register SR13 shown in FIG. 1 is to notify addresses of the memory M40 and data to the outside with the minimum number of output terminals. When all the data of the memory is being notified to the outside, a test period in proportion with the number of all the bits of the memory will be needed. However, such a test method to be implemented by notifying all the data to the outside on good products (acceptance products) will be just a waste of time and inefficient.

Then a control circuit CT11, which receives a defect-detecting signal from a data comparing circuit CP12, operates the shift register SR13. This operation will output outward only the data of the addresses where defects are found and the addresses. While the shift register SR13 is operating, the control circuit CT11 temporally halts the test. When the operation of the shift register SR13 is completed, the memory test for the memory M40 is resumed. Thereafter, as described above, when all the bit tests are completed on the memory M40, the information on defective bits is outputted outside.

Accordingly, the information on all of the defective bits on the memory M40 can be obtained even from one output terminal for testing, and moreover as concerns good quality bits, anything goes in accordance with a normal BIST test so that the test can be finalized in the so-called shortest period of time, which is an advantage obtainable.

The integrated circuit I1 used on such an embodiment of the present invention will be described further in detail as follows with reference to a block diagram shown in FIG. 1, etc.

FIG. 1 is a block diagram showing a first embodiment according to the present invention.

Figure 3:
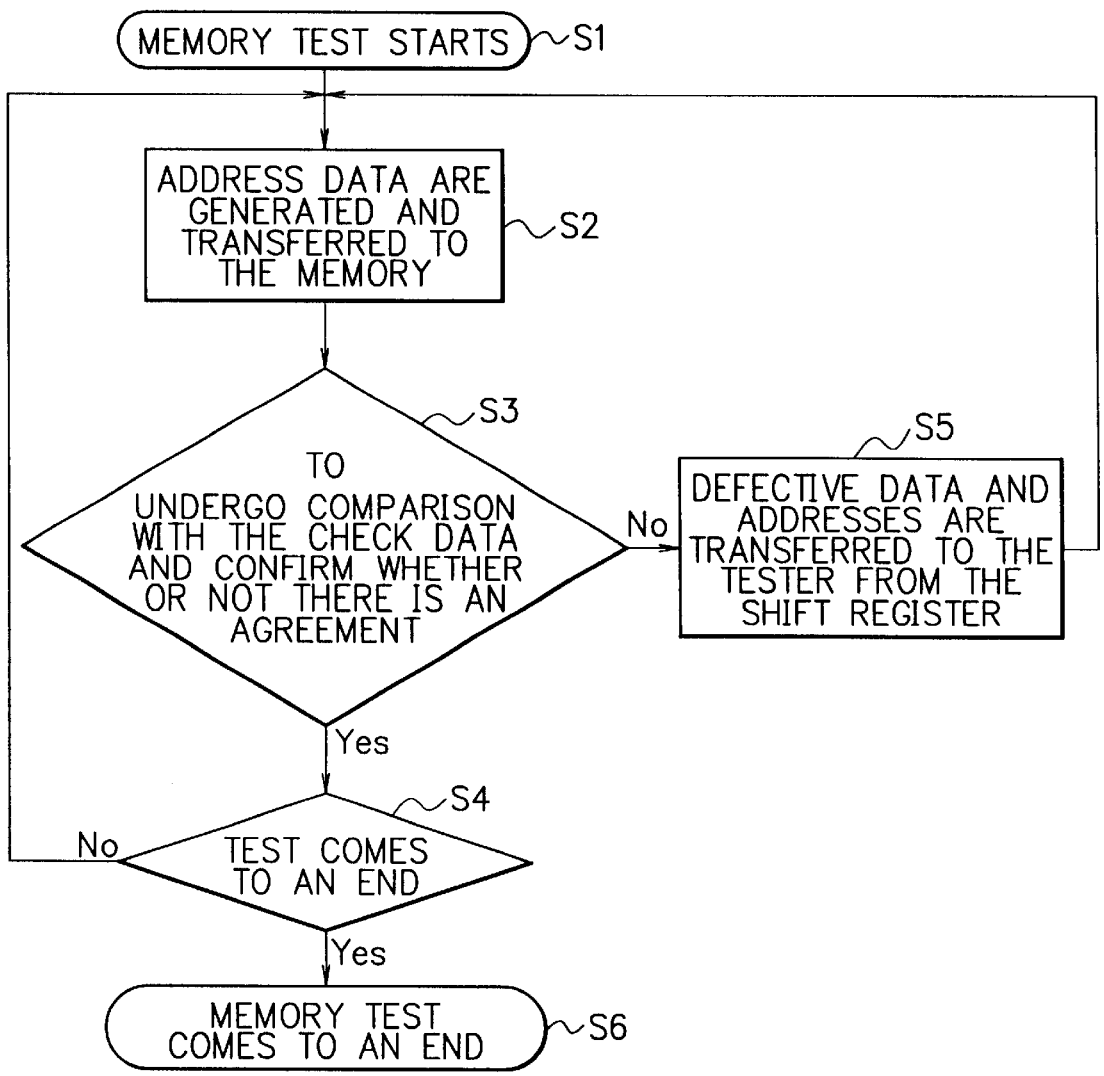
FIG. 3 is a flowchart on a test method for a memory-mounting integrated circuit according to the present invention.

In the test method according to the present invention, as shown in a flowchart in FIG. 3, the integrated circuit I1 is configured so as to normally access the memory M40 from its logic circuit L50, and at the time of testing, the control of the memory M40 is switched so that at the time of testing the BIST circuit B10 controls the memory M40 with the selector SL30. The BIST circuit B10 receives the control signal from the logic tester T60 so as to start the test operation (Step S1).

Inside the BIST circuit B10, the address generating circuit A21, the data generating circuit WD22, and the check data generating circuit RD23 operate in a cooperative fashion so as to generate a test vector programmed in the circuit to operate the memory M40 (Step S2). In the comparing circuit CP12, the output signals from the memory M40 are brought into comparison with the output signals from the check data generating circuit RD23 (Step S3).

In the case where the memory M40 operates in order, these signals correspond to each other (Step S3→Step S4) so that this correspondence is confirmed. In addition, whether or not the test should come to and end is confirmed (Step S4), and in the case where the finalization of the test is confirmed, the memory test is finalized (Step S6). In addition, in the case where the above described memory M40 does not operate in order (or in the case where the memory 40 has any defect), these signals will not coincide (Step S3→Step S5), the defective data as well as addresses are transferred from the shift register to the tester, and subsequently in the case where the test of the memory in the next region has not yet been completed, the memory test starts, and subsequently, as described above, the test is implemented until the memory test ends (Step S5→Step S2. . . ). Thus, the logic tester T (hereinafter to be referred to as the tester as well) receives the above described signals that are coinciding or are not coinciding so that the entire region of the memory M40 undergoes quality judgment.

As described above, the present invention is configured by comprising the shift register SR13 capable of outputting the output data of the memory M40 and the address thereof to the outside of the integrated circuit I1. Thus, also in memory with multi-bits, one output terminal for testing in order to output the output data to the outside will do. Since the shift register SR13 is cause to operate in the case where a defect is detected in the comparing circuit CP12, a serial transmission is preferable for the present invention. Thus the control circuit CT11 receives the outcome signals of the comparing circuit CP12 in order that the entire BIST circuit B10 will be put under control.

The operation of such a first embodiment of the present invention will be described by using the timing chart shown in FIG. 2 and the flowchart shown in FIG. 3.

Figure 2:
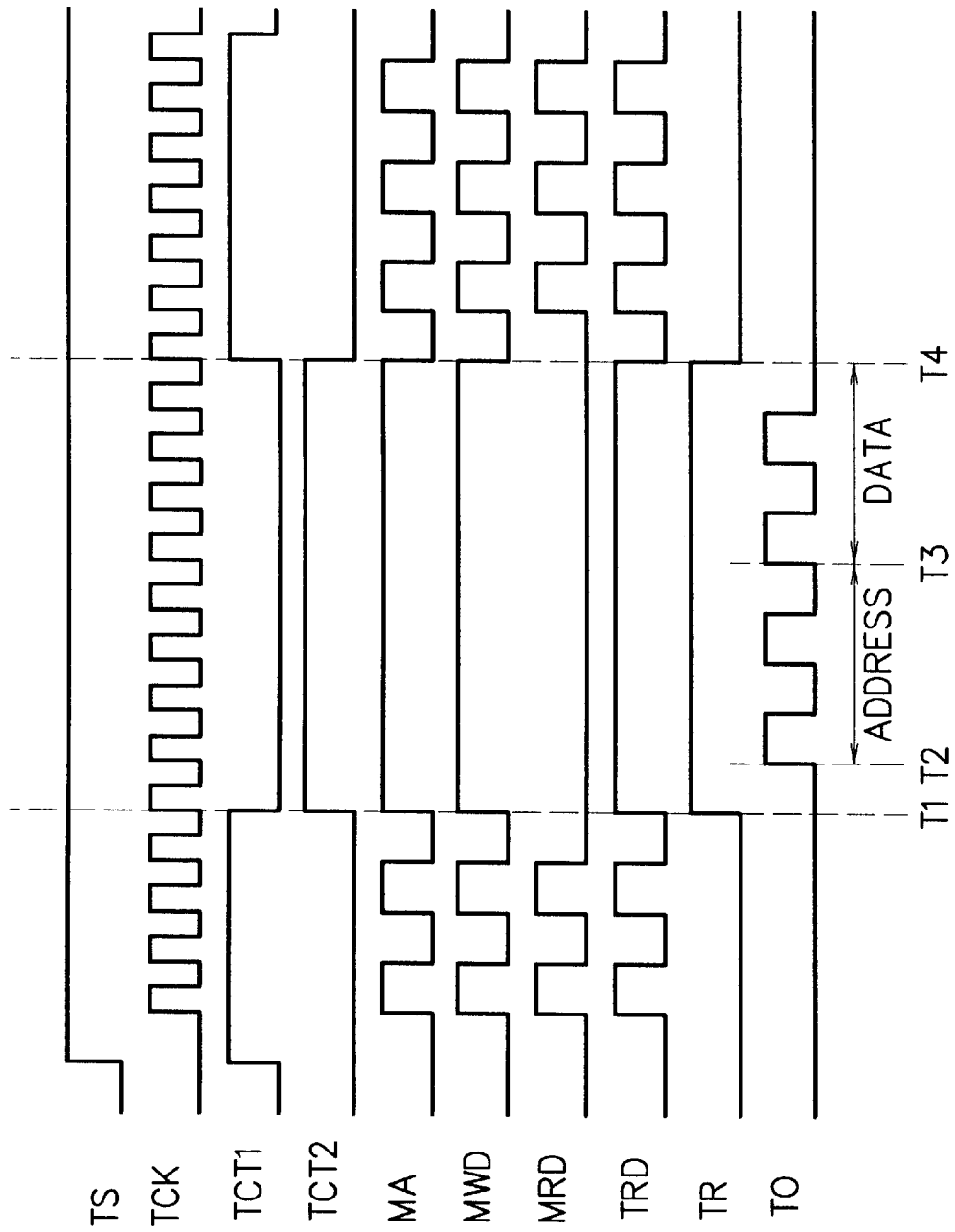
FIG. 2 is a timing chart on a device according to a first embodiment of the present invention.

When the test signal TS is outputted from the tester, as shown in FIG. 2, the TS signal is inputted to the control circuit CT11, and thereby the control signal TCT1 is generated. The generated control signal TCT1 reaches the address generating circuit A21, the data generating circuit WD22, and the check data generating circuit RD23 to reset the address generating circuit A21, the data generating circuit WD22, and the check data generating circuit RD23 of these above described circuits. Thereafter, the test clock TCK is outputted from the logic tester T60 so that this signal TCK is inputted to the address generating circuit A21, the data generating circuit WD22, and the check data generating circuit RD23 via the control circuit CT11. In addition, these circuits, that is, the address generating circuit A21, the data generating circuit WD22 and the check data generating circuit RD23 have this signal TCT1 to be inputted so as to operate in a cooperative fashion and thereby output the address input signal MA, the data input signal MWD and the check data signal TRD as the test vector to the memory M.

The above described address input signal MA and the data input signal MWD is inputted via the selector SL into the memory M40, which is brought into operation so as to output the data output signal MRD.

The comparing circuit CP12 compares the check data signal TRD with the data output signal MRD, and the comparing result signal TR of 0 level is outputted in the case of agreement and that of 1 level is outputted in the case of disagreement.

As shown in FIG. 2, in the case where any defect is found in the memory M at the timing of T1, the comparing result signal TR will be 1since the data output signal MRD does not agree with the check data signal TRD.

As shown in FIG. 2, this result is notified to the logic tester T60 and simultaneously notified to the control circuit CT11 so that the control signal TCT1 becomes invalid (with 0 level), and instead the shift register control signal TCT2 becomes valid (with 1 level). The logic tester T, which has received the comparing result signal TR, will be brought into a state waiting for the test result output signal T0 to be inputted.

On the other hand, the shift register SR 13, which has received the shift register control signal TCT2, outputs from the subsequent timing T2 to the timing T3 the address input signal MA of the memory M in which a defect has been found and from the timing T3 to the timing T4 the data output signal MRD respectively to the test result output signal T0. These results are appropriately totaled up to make it possible to notify precisely what kind of defect is found in which bits in which addresses of the data in the memory. Thus, the shift register SR13 is always secured so that the address numbers from the above described MA as well as the above described MRD can be inputted. Incidentally, this time period from the timing T2 to the timing T3 and the time period from the timing T3 to the timing T4, which are defined by the configuration of the memory M, can be programmed in advance in the BIST circuit B10 (for example, the control circuit CT within the BIST circuit B).

This period until the timing T4, the control signal TCT1 is invalid, and therefore the test operation of the memory M40 halts. Thus, until all the results are completely outputted into the test result output signal T0, the signals inputted into the logic tester is limited to this T0 so as to prevent detecting the subsequent defect from destroying the data of the test result output signal T0. In addition, after reaching the timing T4 when the test result output signal T0 is completely outputted, the control signal TCT1 returns to the valid state and the shift register control signal TCT2 returns to the invalid state. This will resume the testing of the memory M40. Thus, preferably, the present invention efficiently uses a serial communication form so as to prevent without fail the information on a defective memory from being destroyed and to communicate this precisely to outside. Subsequently, until all the tests on the memory M40 is likewise finished for the following steps, the memory test is continued as described above.

If no defects are detected at the time point when all the tests are completed, the memory M40 is judged to be a completely good product. In addition, even if the memory M40 is defective, the information only on the defective spots will be certainly notified to the outside with the above described signal T0.

Second Embodiment

Next, a second embodiment of the present invention will be described. The second embodiment of the present invention can be used to obtain relief information in a memory having redundancy relief circuit. This embodiment additionally comprises a relief possibility/impossibility judging circuit RN14, that judges whether or not the positions or the number of defective bits can be relieved, so that the testing may halt based on the output signals from the added relief capability/incapability judging circuit. This will serve to enable an unnecessary testing to be stopped midway so as to curtail time for the testing. That is, in the flow from Step S3 to Step S5 in the flowchart in FIG. 3 showing operation of the above described first embodiment, the second embodiment hereof comprises "relief possibility/impossibility judging circuit RN14" to be disposed in the preceding step prior to Step S5 in order to judge whether or not relief is possible. Such establishment of the above described relief possibility/impossibility judging circuit RN14 causes the signal CPD being a result of comparison of the TRD signal with the MRD signal in the comparing circuit CP2 to be inputted into the relief possibility/impossibility judging circuit RN14, and in the case where the inputted CPD signal results in the judgment of "relief-capable", the TR2 signal to be outputted by the relief possibility/impossibility judging circuit RN14 is not outputted so that the testing goes on as described in 12th to the 18th paragraph (page 9 line 1 to page 10 line 28) in the first embodiment described above. In addition, in the second embodiment, in the case where the above described inputted CPD signal results in judgment of "relief-impossible", the relief possibility/impossibility judging circuit RN14 outputs the TR2 signal so that the memory test compulsorily comes to an end. Incidentally, FIG. 5, in which a timing chart of the second embodiment hereof is described, mentions and describes the state in which the signal TR2 has been generated in the case where relief is judged to be impossible. In addition, in the case where the TR2 signal is not generated (in the case of relief-capable), in the timing chart of the second embodiment hereof, the signals TS to TRD and TR as well as T0 will have the signal waveform like those in the first embodiment and the signal CPD will have a waveform like the signal TRD.

FIG. 4 shows a block diagram on such a device that is used for the second embodiment of the present invention.

As shown in FIG. 4, the memory M2 is a memory having redundancy relief circuit. The BIST circuit B2 newly and additionally comprises a relief possibility/impossibility judging circuit RN. In addition to this, in the second embodiment hereof, a comparing circuit CP2 has replaced the comparing circuit CP.

The comparing circuit CP2 is much different from the comparing circuit CP in that the comparison result signal CPD obtained with each bit being compared to each other between the data output signals MRD from the memory M2 and the check data signals TRD. This comparing circuit CP2 is different from the above-described first embodiment in that the TRD signal and the M signal are inputted and the later-described comparison result CPD is outputted, nevertheless otherwise this inner configuration is basically similar to that in the above-described first embodiment.

The relief possibility/impossibility judging circuit RN judges whether or not relief is possible based on the comparison result signal CPD and the address input signal MA and from the positions as well as the number of the defective bits so that the test halt signal TR2 is generated in the case that relief is judged to be impossible. This causes the logic tester T to judge the integrated circuit I as a "defective product" with the test halt signal TR2 and to halt the subsequent tests.

The inner configuration of the relief possibility/impossibility judging circuit RN is more or less different depending on the relief method of the memory M2. For example, the most typical example exemplifies that a flag is prepared with regard to whether or not a defective cell having been successfully discovered for each memory cell column to be a replacing unit at the time of remedy, and in the case where a number of flags not less than a certain fixed amount is counted, the setting is implemented so as to judge that the relief is impossible or the like.

As described so far, the second embodiment hereof will have a new advantage that at the time point when the judgment is made on redundancy relief to be impossible the subsequent unnecessary testing is cancelled so that time according to the testing will be able to be shortened.

The operation of such a second embodiment of the present invention will be described in detail as follows using a block diagram shown in FIG. 4 as well as a timing chart shown in FIG. 5.

When the test signal TS is outputted from the tester, as shown in FIG. 4, the TS signal is inputted to the control circuit CT11, and thereby the control signal TCT1 is generated. The generated control signal TCT1 reaches the address generating circuit A21, the data generating circuit WD22, and the check data generating circuit RD23 to reset the address generating circuit A, the data generating circuit WD, and the check data generating circuit RD of these above described circuits. Thereafter, the test clock TCK is outputted from the tester so that this signal TCK is inputted to the address generating circuit A21, the data generating circuit WD22, and the check data generating circuit RD23 via the control circuit CT11, and these circuits, that is, the address generating circuit A21, the data generating circuit WD22 and the check data generating circuit RD23 have this signal to be inputted so as to operate in a cooperative fashion and thereby the above described respective circuits being the test vector to the memory M output the address input signal MA, the data input signal MWD and the check data signal TRD.

The above described address input signal MA and the data input signal MWD is inputted via the selector SL into the memory M40, which is brought into operation so as to output the data output signal MRD.

The comparing circuit CP12 compares the check data signal TRD with the data output signal MRD, and the comparing result signal TR of 0 level is outputted in the case of agreement and that of 1 level is outputted in the case of disagreement.

As shown in FIG. 5, in the case where any defect is found in the memory M at the timing of T1, the comparing result signal TR will be 1since the data output signal MRD does not agree with the check data signal TRD.

As shown in the timing chart in FIG. 5, this result is notified to the logic tester T and simultaneously notified to the control circuit CT so that the control signal TCT1 becomes invalid (with 0 level), and instead the shift register control signal TCT2 becomes valid (with 1 level). The logic tester T, which has received the comparing result signal TR, will be brought into a state waiting for the test result output signal T0 to be inputted.

The shift register S, which has received the shift register control signal TCT2, outputs from the subsequent timing T2 to the timing T3 the address input signal MA of the memory M in which a defect has been found and to the timing T4 the data output signal MRD to the test result output signal T0. These results are appropriately totaled up to make it possible to notify precisely what kind of defect is found in which bits in which addresses of the data in the memory.

In addition, as described above, the comparing circuit CP2 compares the data output signal MRD from the memory M2 with the check data signal TRD so as to output the comparing result signal CPD to the relief possibility/impossibility judging circuit, and the comparing circuit CP2 compares the data output signal MRD from the memory M2 with the check data signal TRD so as to output the TR signal to the logic tester T60 as described in the first embodiment.

In addition, the relief possibility/impossibility judging circuit RN14 judges whether relief is possible or not based on the comparison result signal CPD and the address input signal MA and from the positions as well as the number of the defective bits so that the test halt signal TR2 is generated in the case that the relief is judged to be impossible. This causes the logic tester T to judge the integrated circuit I1 as a "defective product" with the test halt signal TR2 and thereafter the logic tester T60 outputs the TS signal to halt the subsequent tests. Incidentally, the above described time period from the timing T2 to the timing T3 and the time period from the timing T3 to the timing T4, which are defined by the configuration of the memory M as in the above described first embodiment, can be programmed in advance in the BIST circuit B as described in the above described first embodiment. In addition, in the relief possibility/impossibility judging circuit RN14, in the case of minimum necessary capacity of the memory for the integrated circuit I1 being 32 bits for example, and in the case where the memory M is produced to have 34 bits in advance and have the faulty memory sections at the third bit and the eighteenth bit without any other faulty memory spots so that the minimum 32 bits are secured for a memory capacity, that is confirmed by the relief possibility/impossibility judging circuit RN14, the signal TR2 is not generated. However, for example when further defective sections have been generated in the 25th bit and the subsequent 26th through 29th bits, the following will be applied. That is, at the time point when the relief possibility/impossibility judging circuit RN14 can no longer secure the minimum bit quantity of 32 at the above described 25th but 31 bits, the signal TR2 is generated so that the subsequent testing comes to an end. Thus, in the present invention, appropriately considering the failure ratio in a memory, the capacity at the time of production of the memory M can be set so that production costs on the integrated circuit I1 can be reduced.

In addition, in the case where the relief possibility/impossibility judging circuit RN14 judges the relief to be possible (in the case where no TR2 signal is outputted), the testing will be executed as described in the chapter on the first embodiment. Incidentally, in the case where the testing is continued, as shown in the timing chart shown in FIG. 5, until the timing T4, the control signal TCT1 remains invalid and the test operation on the memory M halts so as to prevent the data destruction on the test result output signal T0 due to detecting the next defect by the time when all the results are completely outputted to the test result output signal T0. Then at the timing T4 when the test result output signal T0 is completely outputted, the control signal TCT1 returns to the valid state and the shift register control signal TCT2 returns to the invalid state. This serves to resume the testing on the memory M. Subsequently, the testing will be continued likewise until the testing on all the memories M is completed.

Thus, in the test method according to the present invention, a particular BIST circuit is used so that costs to incur for a tester can be reduced and the contents on defects is notified to outside as serial data with the shift register so that the number of the input-output terminals for testing necessary on the integrated circuit can be regulated, and in principle all the contents of defects on a memory will be capable of undergoing monitoring from outside.

Thereby, also in the case where, without placing a limit in a period with less achievement in particular, decrease in the yield factor on the integrated circuit I1 might take place due to problems that processes or circuits have, information such as the number of defective bits, dependency on the defective bit addresses, and the contents of defects, etc. are obtained so that the information can be utilized to analyze the cause of problems giving rise to defects.

Moreover, the test method according to the present invention has a a new advantage that at the time point when the judgment is made on redundancy relief to be impossible the subsequent unnecessary testing is stopped so that time according to the testing will be able to be shortened.

What is claimed is:

1. A memory-mounting integrated circuit on which at least a built in self test (BIST) circuit and a memory are mounted, said BIST circuit comprising:

data storing means for storing data in said memory for a memory test of said memory comparing means for comparing a memory test data signal for a memory region of said memory with corresponding data from said memory region of said memory stored by said data storing means for outputting a first comparing signal;

control means for controlling outputting of defective data comprising said corresponding data and an address for said region of said memory outward from the integrated circuit based on said first comparing signal outputted by said comparing means, and halting said memory test until outward outputting of said defective data is complete; and output means for outputting said defective data outward from said integrated circuit as controlled by said control means.

2. The memory-mounting integrated circuit according to claim 1, wherein said comparing signal is a defect-detecting signal.

3. The memory-mounting integrated circuit according to claim 1, wherein said defective data is output sequentially on one output terminal from the integrated circuit.

4. A memory-mounting integrated circuit on which at least a built in self test (BIST) circuit and a memory are mounted, said BIST circuit comprising:

data storing means for storing data in said memory for a memory test of said memory;

comparing means for comparing a memory test data signal for a memory region of said memory with corresponding data from said memory region of said memory stored by said data storing means for outputting a first comparing signal;

control means for controlling outputting of defective data comprising said corresponding data and an address for said region of said memory outward from the integrated circuit based on said first comparing signal outputted by said comparing means, and halting said memory test until outward outputting of said defective data is complete;

output means for outputting said defective data outward from said integrated circuit as controlled said control means;

address generating means for generating addresses for said memory test of said memory; and data generating means for generating memory test data for said memory test of said memory, wherein said control means controls said address generating means and said data generating means.

5. A memory-mounting integrated circuit on which at least a built in self test (BIST) circuit and a memory are mounted, said BIST circuit comprising:

data storing means for storing data in said memory, for a memory test of said memory;

comparing means for comparing a memory test data signal for a memory region of said memory with corresponding data from said memory region of said memory stored by said data storing means for outputting a first comparing signal;

control means for controlling outputting of defective data comprising said corresponding data and an address for said region of said memory outward from the integrated circuit based on the first comparing signal outputted by said comparing means, and hating said memory test until outward outputting of said defective data is complete;

output means for outputting said defective data outward from said integrated circuit as controlled by said control means; and judging means for comparing said memory test data signal with said corresponding data from said memory region of said data storing means for determining whether to end said memory test or to continue said memory test.

6. A memory-mounting integrated circuit on which at least a built in self test (BIST) circuit and a memory are mounted, said BIST circuit comprising:

data storing means for storing data in said memory for a memory test of said memory;

comparing means for comparing a memory test data signal for a region of said memory with corresponding data from said memory region of said memory stored by said data storing means for outputting a first comparing signal;

control means for controlling outputting of defective data comprising said corresponding data and an address for said region of said memory outward from the integrated circuit based on said first comparing signal outputted by said comparing means, and halting said memory test until outward outputting of said defective data is complete;

output means for outputting said defective data outward from said integrated circuit as controlled by said control means, address generating means for generating addresses for said memory test of said memory;

data generating means for generating memory test data for said memory test of said memory, wherein said control means controls said address generating means and said data generating means; and judging means for comparing said memory test data signal with said corresponding data from said memory region of said data storing means for determining whether to end said memory test or to continue said memory test.

7. A method for testing a memory region of a memory-mounting integrated circuit on which a built in self test (BIST) circuit and a memory are mounted, said method comprising:

(a) storing data in said memory region of said memory for a memory test of said memory;

(b) comparing a memory test data signal for said memory region with corresponding data from said memory region stored in step (a) for outputting a first comparing signal;

(c) controlling outputting of defective data comprising said corresponding data and an address for said region of said memory outward from the integrated circuit based on said first comparing signal outputted in step (b); and (d) halting said memory test until outward outputting of said defective data is complete.

8. A method for testing a memory region of a memory-mounting integrated circuit according to claim 7, wherein said defective data is output sequentially on one output terminal from the integrated circuit.

9. A method for testing a memory region of a memory-mounting integrated circuit on which a built in self test (BIST) circuit and a memory are mounted, said method comprising:

(a) storing data in said memory region of said memory for a memory test of said memory;

(b) comparing a memory test data signal for said memory region with corresponding data from said memory region stored in step (a) for outputting a first comparing signal;

(c) controlling outputting of defective data comprising said corresponding data and an address for said region of said memory outward from the integrated circuit based on said first comparing signal outputted in step (b);

(d) baiting said memory test until outward outputting of said defective data is complete; and (e) resuming said memory test when said outward outputting is complete.

10. A method for testing a memory region of a memory-mounting integrated circuit on which a built in self test (BIST) circuit and a memory are mounted, said method comprising:

(a) storing data in said memory region of said memory for a memory test of said memory;

(b) comparing a memory test data signal for said memory region with corresponding data from said memory region stored in step (a) for outputting a first comparing signal;

(c) controlling outputting of defective data comprising said corresponding data and an address for said region of said memory outward from the integrated circuit based on said first comparing signal outputted in step (b); and (d) comparing said memory test data signal with said corresponding data from said memory region for determining whether to end said memory test or to continue said memory test.

11. A method for testing a memory region of a memory-mounting integrated circuit on which a built in self test (BIST) circuit and a memory are mounted, said method comprising:

(a) storing data in said memory region of said memory for a memory test of said memory;

(b) comparing a memory test data signal for said memory region with corresponding data from said memory region stored in step (a) for outputting a first comparing signal;

(c) controlling outputting of defective data comprising said corresponding data and an address for said region of said memory outward from the integrated circuit based on said first comparing signal outputted in step (b);

(d) resuming said memory test when said outward outputting is complete; and (e) comparing said memory test data signal with said corresponding data from said memory region for determining whether to end said memory test or to continue said memory test.

* * * * *